United States Patent
Kwak et al.

(10) Patent No.: US 9,142,622 B2
(45) Date of Patent: Sep. 22, 2015

(54) METHOD OF GROWING NITRIDE SEMICONDUCTOR LAYER, NITRIDE SEMICONDUCTOR DEVICE, AND METHOD OF FABRICATING THE SAME

(71) Applicant: SEOUL VIOSYS CO., LTD., Ansan-si (KR)

(72) Inventors: Woo Chul Kwak, Ansan-si (KR); Seung Kyu Choi, Ansan-si (KR); Jae Hoon Song, Ansan-si (KR); Chae Hon Kim, Ansan-si (KR); Jung Whan Jung, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/091,808

(22) Filed: Nov. 27, 2013

(65) Prior Publication Data

US 2014/0151713 A1 Jun. 5, 2014

(30) Foreign Application Priority Data

Nov. 30, 2012 (KR) .................. 10-2012-0138050

(51) Int. Cl.
*H01L 21/02* (2006.01)
*H01L 29/20* (2006.01)
(Continued)

(52) U.S. Cl.
CPC ............ *H01L 29/2003* (2013.01); *C30B 25/20* (2013.01); *C30B 29/406* (2013.01); *H01L 21/0242* (2013.01); *H01L 21/0254* (2013.01); *H01L 21/0262* (2013.01); *H01L 21/02389* (2013.01); *H01L 21/02433* (2013.01); *H01L 21/02458* (2013.01)

(58) Field of Classification Search
CPC .................... H02L 39/2003; H01L 21/02389; H01L 21/02458; H01L 21/0254; H01L 21/02433; H01L 21/0262; H01L 21/0242; C30B 25/20; C30B 29/406
USPC .................... 257/79, 183, 190, 200, E33.025, 257/E33.028, E33.03, E33.033
See application file for complete search history.

(56) References Cited

U.S. PATENT DOCUMENTS

| 2003/0020087 A1 | 1/2003 | Goto et al. | |
| 2003/0132441 A1* | 7/2003 | Takatani et al. | 257/79 |

(Continued)

FOREIGN PATENT DOCUMENTS

| EP | 0 922 792 | 6/1999 |
| EP | 2 055 811 | 5/2009 |

(Continued)

OTHER PUBLICATIONS

Paskova et al. GaN Substrates for III-Nitride Devices, Proceedings of the IEEE, 2010 (98), 7, pp. 1324-1338.*

(Continued)

*Primary Examiner* — Galina Yushina
(74) *Attorney, Agent, or Firm* — H.C. Park & Associates, PLC

(57) ABSTRACT

Exemplary embodiments of the present invention provide a method of growing a nitride semiconductor layer including growing a gallium nitride-based defect dispersion suppressing layer on a gallium nitride substrate including non-defect regions and a defect region disposed between the non-defect regions, and growing a gallium nitride semiconductor layer on the defect dispersion suppressing layer.

6 Claims, 5 Drawing Sheets

(51) Int. Cl.
*C30B 25/20* (2006.01)
*C30B 29/40* (2006.01)

(56) References Cited

U.S. PATENT DOCUMENTS

2009/0081857 A1* 3/2009 Hanser et al. ............... 438/507
2009/0180505 A1* 7/2009 Kohda et al. ............. 372/43.01
2010/0080107 A1* 4/2010 Koda et al. ................. 369/122

FOREIGN PATENT DOCUMENTS

JP 2011207640 * 10/2011 .............. C30B 19/10
WO 2008048303 4/2008

OTHER PUBLICATIONS

European Search Report issued Jul. 3, 2014 in EP Application No. 13194874.7.

* cited by examiner (a)

(b)

(a)

(b)

(a)

(b)

(a)

(b)

METHOD OF GROWING NITRIDE SEMICONDUCTOR LAYER, NITRIDE SEMICONDUCTOR DEVICE, AND METHOD OF FABRICATING THE SAME

CROSS-REFERENCE TO RELATED APPLICATION

This application claims priority from and the benefit of Korean Patent Application No. 10-2012-0138050, filed on Nov. 30, 2012, which is hereby incorporated by reference for all purposes as if fully set forth herein.

BACKGROUND

1. Field

Exemplary embodiments of the present invention relate to a method of growing a nitride semiconductor layer, a nitride semiconductor device, and a method of fabricating the same, and, more particularly, to a method of growing a nitride semiconductor layer on a growth substrate prepared using a tiling technique and a nitride semiconductor device and method of fabricating the same using the nitride semiconductor layer.

2. Discussion of the Background

Nitride semiconductors such as gallium nitride semiconductors may have a wide energy band gap and may be of a direct transition type. Nitride semiconductors may be used in fabrication of semiconductor devices, such as light emitting devices having a relatively short wavelength emission range, for example, ultraviolet, blue, and green light emitting devices, electronic devices, and the like.

A nitride semiconductor layer may be grown on a heterogeneous substrate such as a sapphire substrate due to difficulty in preparation of a homogeneous substrate. However, the nitride semiconductor layer grown on the heterogeneous substrate may have a high-density of crystal defects such as thread dislocations, and thus not be suited for fabricating a device capable of being operated under high current density.

Thus, techniques for preparing a nitride semiconductor layer using a homogeneous substrate, such as a gallium nitride substrate, as a growth substrate have been developed in recent years. For example, a bulk gallium nitride single crystal may be grown on a sapphire substrate via hydride vapor phase epitaxy (HVPE) and sliced to prepare a gallium nitride growth substrate.

For mass production of semiconductor devices by growing a semiconductor layer on a substrate, it may be necessary for a growth substrate to have a relatively large size. Currently, a substrate used to fabricate optical devices such as light emitting diodes may have a size of 2 inches or more.

A c-plane gallium nitride substrate may be obtained as a large substrate having a size of about 2 inches by slicing a bulk single crystal. However, it may be difficult to form semipolar substrates or non-polar substrates, such as m-plane or a-plane gallium nitride substrates, to a size of 2 inches or more using the above method due to a limit on a growth plane or growth thickness. For this reason, studies based on non-polar or semi-polar gallium nitride substrates are mostly limited to growth of a nitride crystal using the non-polar or semi-polar substrate having a size of less than 1 inch, for example, having a maximum width of several millimeters or less.

To provide a large-area growth substrate, a technique has been developed in which a plurality of seed substrates each having a desired crystal growth plane is arranged thereon and nitride semiconductor layers are then grown on the seed substrates, followed by slicing the grown nitride semiconductor layers.

However, due to use of the plural seed substrates, a nitride crystal grown on a boundary line between the seed substrates may include a high density of crystal defects. In addition, a gallium nitride substrate prepared using the seed substrates may show a relatively large difference in off-angle depending upon a location due to a difference in crystal orientation between the seed substrates. Even though the off-angle and arrangement of the seed substrates may be controlled, it may be difficult to completely remove off-angle distribution on the gallium nitride substrate. Thus, a portion of the nitride crystal corresponding to a boundary region between the seed substrates may act as a defect source upon growth of the nitride semiconductor layer on the gallium nitride substrate.

Moreover, a defect generated in the semiconductor layer may be transferred in a vertical direction, and also spread over a significantly wide area. As a result, it may be difficult to secure a semiconductor layer region capable of providing a semiconductor device exhibiting good properties, thereby decreasing productivity and yield.

SUMMARY OF THE INVENTION

Exemplary embodiments of the present invention provide a method of growing a nitride semiconductor layer having good crystal quality using a gallium nitride substrate having a defect region as a growth substrate, a nitride semiconductor device, and a method of fabricating the semiconductor device using the nitride semiconductor layer.

Exemplary embodiments of the present invention also provide a method of growing a nitride semiconductor layer capable of preventing a defect region of a gallium nitride substrate ranging from spreading in a semiconductor layer grown on the substrate.

Exemplary embodiments of the present invention also provide a method of fabricating a non-polar or semi-polar semiconductor device, which is mass producible at high yield.

Additional features of the invention will be set forth in the description which follows, and in part will be apparent from the description, or may be learned by practice of the invention.

An exemplary embodiment of the present invention discloses a method of growing a nitride semiconductor layer, the method including growing a gallium nitride-based defect dispersion suppressing layer on a gallium nitride substrate comprising non-defect regions and a defect region disposed between the non-defect regions, and growing a gallium nitride semiconductor layer on the defect dispersion suppressing layer.

An exemplary embodiment of the present invention also discloses a method of growing a gallium nitride substrate, the method including preparing the gallium nitride substrate by growing a gallium nitride crystal on seed substrates using hydride vapor phase epitaxy (HVPE), followed by slicing the gallium nitride crystal, growing a gallium nitride-based defect dispersion suppressing layer on the gallium nitride substrate using metal organic chemical vapor deposition, and growing a gallium nitride semiconductor layer on the defect dispersion suppressing layer.

An exemplary embodiment of the present invention also discloses a gallium nitride substrate including non-defect regions and a defect region disposed between the non-defect regions, a gallium nitride-based defect dispersion suppressing layer disposed on the gallium nitride substrate, and a gallium nitride semiconductor layer disposed on the defect dispersion suppressing layer.

It is to be understood that both the foregoing general description and the following detailed description are exemplary and explanatory and are intended to provide further explanation of the invention as claimed

BRIEF DESCRIPTION OF THE DRAWINGS

The above and other aspects, features, and advantages of the present invention will become apparent from the detailed description of the following exemplary embodiments in conjunction with the accompanying drawings.

DETAILED DESCRIPTION OF THE ILLUSTRATED EMBODIMENTS

Figure 1:
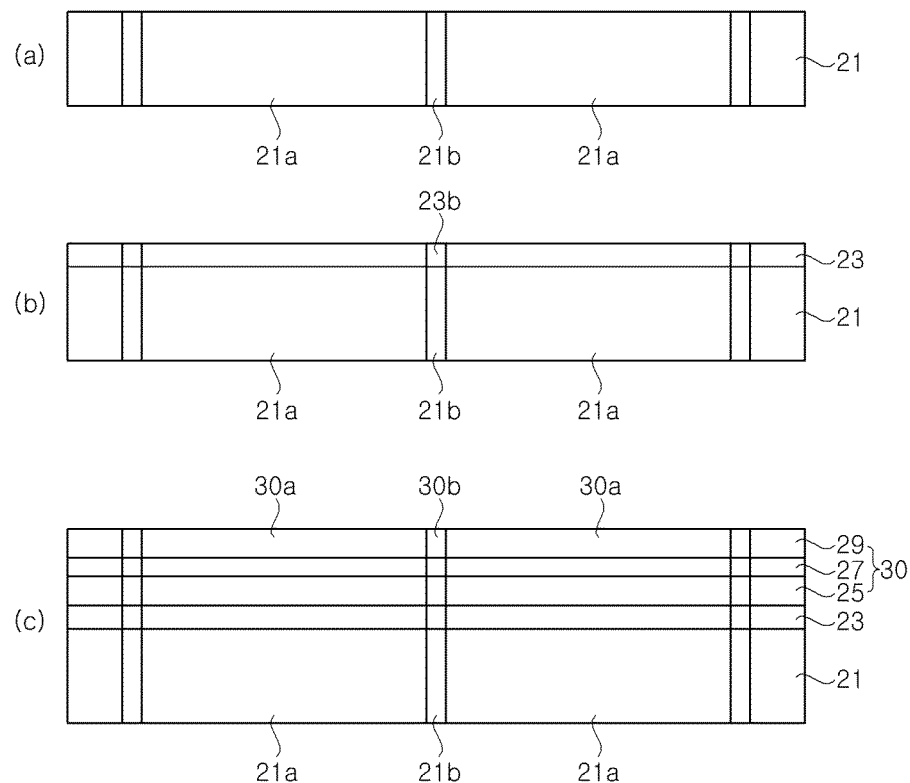
FIG. 1 shows schematic sectional views of a method of growing a nitride semiconductor layer and a method of fabricating a semiconductor device according to an exemplary embodiment of the present invention.

Hereinafter, exemplary embodiments of the present invention will be described in detail with reference to the accompanying drawings. It should be understood that the present invention is not limited to the following exemplary embodiments and may be embodied in different ways, and that the exemplary embodiments are provided for complete disclosure and thorough understanding of the invention by those skilled in the art. In the drawings, the widths, lengths, thicknesses and the like of components may be exaggerated for convenience. Like components will be denoted by like reference numerals throughout the specification.

FIG. 1 shows schematic sectional views illustrating a method of growing a nitride semiconductor layer and a method of fabricating a semiconductor device according to an exemplary embodiment of the present invention.

Referring to FIG. 1(a), a gallium nitride substrate 21 is prepared. The gallium nitride substrate 21 may be provided by growing a gallium nitride single crystal on a plurality of seed substrates using hydride vapor phase epitaxy, followed by slicing the gallium nitride single crystal.

The gallium nitride substrate 21 includes a plurality of non-defect regions 21a corresponding to the plural seed substrates and at least one defect region 21b located between the non-defect regions 21a. Although the non-defect regions 21a may have the same growth plane, the non-defect regions 21a may have different off-angles. For example, the non-defect regions 21a may have a semi-polar or non-polar growth plane. In particular, the semi-polar growth plane may be, for example, (20-21) plane, and the non-polar growth plane may be an m-plane or a-plane. When the growth plane is an m-plane, the non-defect regions 21a has an off-angle with respect to [0001] direction, for example, from about −4° to about −10°, and may be from about −4° to −6°. At an off-angle from −4° to −10° with respect to the [0001] direction, the In content may be increased in an active layer.

Referring to FIG. 1(b), a gallium nitride-based defect dispersion suppressing layer 23 is grown on the substrate 21. The defect dispersion suppressing layer 23 may have the same composition as a semiconductor layer 25, for example, and may be formed of GaN, and may include Al and In in a composition ratio of less than 0.3. However, the defect dispersion suppressing layer 23 is grown under different process conditions from those of the semiconductor layer (for example, 25 of FIG. 1(c)) to be grown thereon, and may be grown by metal organic chemical vapor deposition.

The defect dispersion suppressing layer 23 is grown under different conditions from those of the semiconductor layer 25 to be grown thereon, for example, in terms of growth temperature, growth rate, growth pressure, and the like. In particular, the defect dispersion suppressing layer 23 may be grown at a lower temperature than the semiconductor layer 25 to be grown thereon. The semiconductor layer 25 may be grown at a temperature exceeding 1000° C., and the defect dispersion suppressing layer 23 may be grown at a temperature ranging from 900° C. to 1000° C. In particular, the defect dispersion suppressing layer 23 may be grown at a temperature ranging from 960° C. to 970° C. An optimum growth temperature for the defect dispersion suppressing layer 23 may slightly vary according to the growth plane of the gallium nitride substrate 21.

In addition, the defect dispersion suppressing layer 23 may be grown at a slower rate than the semiconductor layer 25 to be grown thereon. For example, the growth rate of the defect dispersion suppressing layer 23 may be about half that of the semiconductor layer 25, and may range from 1.5 μm/hr to 2.5 μm/hr, an may be from 1.5 μm/hr to 2.0 μm/hr.

The defect dispersion suppressing layer 23 is an epitaxial growth layer unlike a polycrystalline low temperature buffer layer formed on a heterogeneous substrate, such as a sapphire substrate. The defect dispersion suppressing layer 23 is grown while maintaining crystallinity of the substrate 21, and is grown to a thickness from 1 μm to 4 μm, and may be from 1.5 μm to 2.5 μm. The defect dispersion suppressing layer 23 may have a defect region 23b corresponding to the defect region 21b of the substrate 21. The defect region 23b may have a width similar to or narrower than that of the defect region 21b.

The defect dispersion suppressing layer 23 may be grown under a growth pressure different from or the same as that of the semiconductor layer 25. For example, the defect dispersion suppressing layer 23 is grown at a pressure ranging from 100 torr to 400 torr, and may be at about 150 torr. A volume ratio of $H_2$ to a total gas is maintained within about 30%, and a growth process may be performed in a $N_2$ atmosphere without use of $H_2$.

Referring to FIG. 1(c), a gallium nitride semiconductor layer 30 is grown on the defect dispersion suppressing layer 23. According to the present exemplary embodiment, the gallium nitride semiconductor layer 30 may include a semiconductor layer that is an n-type contact layer 25, an active layer 27, and a p-type contact layer 29. However, the semiconductor layer 25 may alternatively be a p-type layer, and layer 29 may be an n-type layer. The gallium nitride semiconductor layer 30 may be grown via metal organic chemical vapor deposition.

The n-type contact layer 25 may include, for example, n-type GaN, the active layer 27 may have a single or multi-quantum well structure, which includes an InGaN quantum well layer, and the p-type contact layer 29 may include p-type GaN. Each of the n-type and p-type contact layers 25, 29 may consist of a single layer or multiple layers. The n-type contact layer 25 may be grown at a temperature of 1000° C. or more, and may be grown at a temperature ranging from 1000° C. to 1030° C.

According to the present exemplary embodiment, the defect dispersion suppressing layer 23 is grown between the substrate 21 and the n-type contact layer 25 under different conditions from those of the n-type contact layer 25, thereby preventing the defect region 21b in the substrate 21 from being dispersed into the semiconductor layer 30. As a result, a width of a defect region 30b in the semiconductor layer 30 can be controlled not to exceed two times the width of the defect region 21b in the substrate 21. Thus, a relatively wide non-defect region 30a can be secured, and a semiconductor device can be fabricated in high yield by forming a device separation region in the defect region 30b. That is, the defect region 30b may be disposed under the space between two semiconductor light emitting elements of the semiconductor device.

Figure 2:
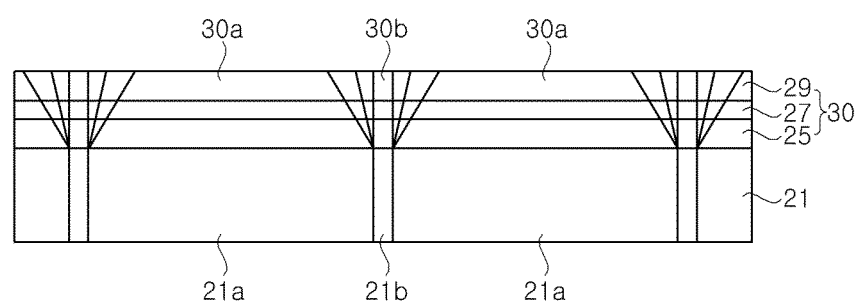
FIG. 2 is a schematic sectional view of a nitride semiconductor layer grown without a defect dispersion suppressing layer.

FIG. 2 is a schematic sectional view of a nitride semiconductor layer grown without the defect dispersion suppressing layer 23.

Referring to FIG. 2, there is a difference in that the defect dispersion suppressing layer 23 is not present on a substrate 21, as compared with FIG. 1. In FIG. 2, an n-type contact layer 25 is directly grown on the substrate 21.

The defect region 21b in the substrate 21 is dispersed in the semiconductor layer 25, and thus is more dispersed in the active layer 27 and the p-type contact layer 29 thereon.

As a result, the defect region 30b is widely formed on a surface of the nitride semiconductor layer 30, and the non-defect region 30a becomes narrow.

Here, although the defect region 30b is illustrated as being symmetrically dispersed in the semiconductor layer 30, the defect region 30b may be dispersed more into one side depending on an off-angle.

The defect dispersion suppressing layer 23 of FIG. 1 prevents the defect region 30b from being dispersed into the semiconductor layer 30 as in FIG. 2. In particular, the defect dispersion suppressing layer 23 prevents the defect region 21b from being dispersed into the n-type contact layer 25.

(Growth of Semi-Polar Semiconductor Layer)

Figure 3:
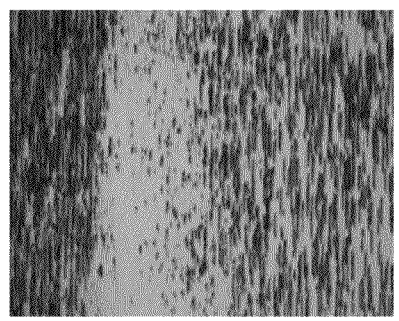
FIG. 3(a) and FIG. 3(b) are microscope images showing a surface of a semi-polar nitride semiconductor layer grown without a defect dispersion suppressing layer.
Figure 3:
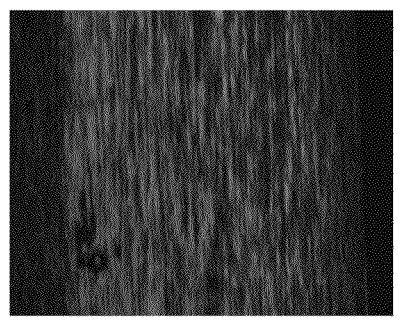

FIGS. 3(a) and 3(b) are microscope images showing a surface of a semi-polar nitride semiconductor layer grown without a defect dispersion suppressing layer.

As described in FIG. 2, specimens of FIGS. 3(a) and 3(b) were prepared by directly growing an n-type GaN contact layer 25 on a gallium nitride substrate 21 having a (20-21) growth plane, followed by growing semiconductor layers including an active layer 27 and a p-type contact layer 29 thereon under the same conditions.

In the specimens of FIGS. 3(a) and 3(b), a semiconductor layer 30 was grown under substantially the same conditions, and there is only a slight difference in growth temperature of the n-type contact layer 25. The n-type semiconductor layer 25 was grown at a rate of about 3 μm/hr and a pressure of about 150 torr. As shown in FIGS. 3(a) and 3(b), it can be confirmed that a defect region (shown as darker area) was dispersed over a wide area on the surface of the semiconductor layer 30 (shown as lighter area) when the semiconductor layer 30 was grown without a defect dispersion suppressing layer.

Figure 4:
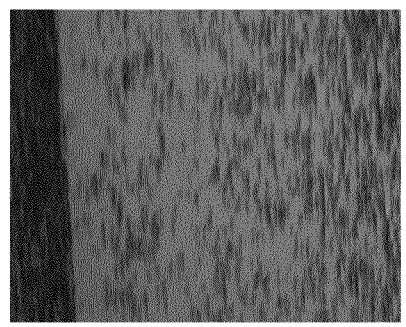
FIG. 4(a) and FIG. 4(b) are microscope images showing surfaces of semi-polar nitride semiconductor layers on defect dispersion suppressing layers grown at relatively high and low temperatures, respectively.
Figure 4:
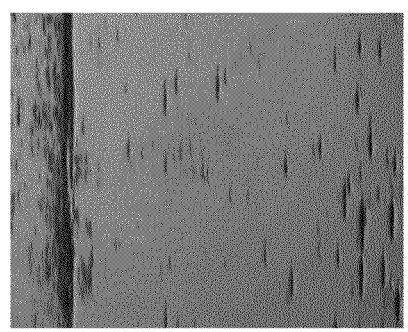

FIGS. 4(a) and 4(b) are microscope images showing surfaces of semi-polar nitride semiconductor layers on defect dispersion suppressing layers grown at relatively high and low temperatures (1030° C. and 970° C.), respectively.

Specimens of FIGS. 4(a) and 4(b) were prepared by growing a GaN defect dispersion suppressing layer 23 on a substrate 21 having a (20-21) growth plane, followed by growing a semiconductor layer 30 thereon in a similar manner as described with reference to FIG. 1(b). The specimen of FIG. 4(a) was prepared by growing the defect dispersion suppressing layer 23 at 1030° C. and at a rate of about 1.8 μm/hr, followed by decreasing the temperature and growing the n-type semiconductor layer 25 at about 1000° C., and the specimen of FIG. 4(b) was prepared by growing the defect dispersion suppressing layer 23 at about 970° C. and at a rate of about 1.8 μm/hr, followed by increasing the temperature and growing the n-type semiconductor layer 25 at about 1000° C. Both the defect dispersion suppressing layers 23 had a growth pressure of 400 torr, and both the n-type semiconductors 25 had a growth rate of about 3 μm/hr and a growth pressure of 150 torr. Both the specimens of FIGS. 4(a) and 4(b) were grown to a thickness of about 0.8 μm.

Referring to FIGS. 4(a) and 4(b), it can be confirmed that the surface quality of the semiconductor layer 30 (shown as lighter area) was improved by interposing the defect dispersion suppressing layer 23 between the substrate 21 and the semiconductor layer 30. In particular, it can be confirmed that the surface quality of the semiconductor layer 30 was improved, and that the width of the defect region 30b (shown as darker area) became narrow by decreasing the growth temperature of the defect dispersion suppressing layer 23 from 1030° C. to 970° C.

Figure 5:
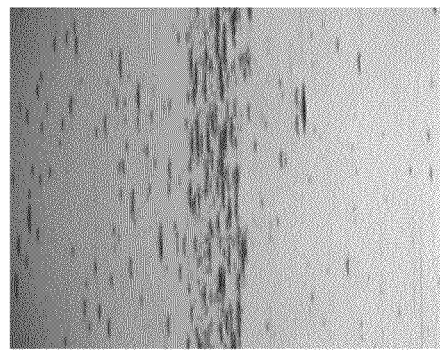
FIG. 5(a) and FIG. 5(b) are microscope images showing surfaces of semi-polar nitride semiconductor layers on defect dispersion suppressing layers grown at a relatively low temperature under different growth pressures, respectively.
Figure 5:
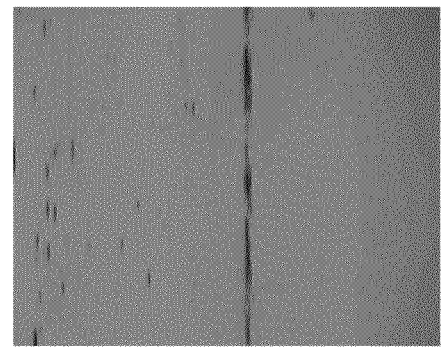

FIGS. 5(a) and 5(b) are microscope images showing surfaces of semi-polar nitride semiconductor layers on defect dispersion suppressing layers grown at a relatively low temperature (970° C.) under different growth pressures (400 torr, 150 torr), respectively.

A specimen of FIG. 5(a) was prepared by growing the defect dispersion suppressing layer 23 and the semiconductor layer 30 under substantially the same conditions as in the specimen of FIG. 4(b), except that the defect dispersion suppressing layer 23 had a thickness of about 1.5 μm, which is about two times the thickness of the defect dispersion suppressing layer 23 in the specimen of FIG. 4(b). There is a difference between the specimens of FIGS. 5(a) and 5(b) in that the defect dispersion suppressing layer 23 was grown under the same pressure of about 150 torr as that of the n-type semiconductor layer 25 in the specimen of FIG. 5(b).

Referring to FIGS. 5(a) and 5(b), it can be confirmed that the surface quality of the semiconductor layer 30 (shown as lighter area) was improved by increasing the thickness of the defect dispersion suppressing layer 23 as compared with the specimen of FIG. 4(b). Further, the surface quality can be further improved by adjusting the growth pressure.

From the experimental results, dispersion of the defect region 30b can be suppressed by growing the defect dispersion suppressing layer 23 on the substrate 21 under different growth conditions from those of the n-type semiconductor layer 25. In particular, the width of the defect region 30b can be reduced by adjusting the growth temperature and/or the growth rate of the defect dispersion suppressing layer 23 to a lower value than the growth temperature and/or the growth rate of the n-type semiconductor layer 25, respectively.

Figure 6:
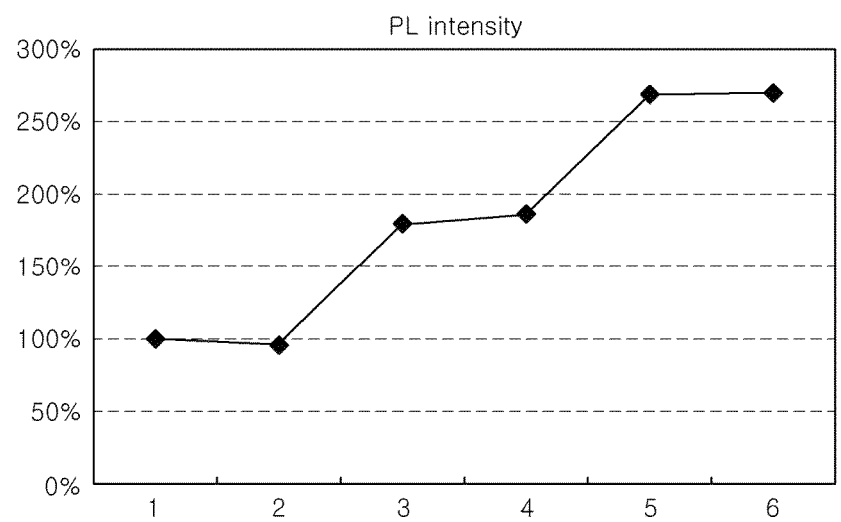
FIG. 6 is a graph depicting photoluminescence (hereinafter referred as PL) intensities of six specimens of FIG. 3(a), FIG. 3(b), FIG. 4(a), FIG. 4(b), FIG. 5(a), and FIG. 5(b), respectively.

FIG. 6 is a graph depicting PL intensities of six specimens of FIG. 3(a), FIG. 3(b), FIG. 4(a), FIG. 4(b), FIG. 5(a), and FIG. 5(b), respectively.

Referring to FIG. 6, it can be confirmed that PL intensity was improved as the surface quality of the semiconductor layer 30 was improved. In particular, when the defect dispersion suppressing layer 23 was interposed between the substrate 21 and the semiconductor layer 25, the PL intensity was increased as compared with the specimen free from the defect dispersion suppressing layer 23 even though the defect dispersion suppressing layer 23 was grown at a relatively high temperature (1030° C.) as in the specimen 3 of FIG. 4(a).

Further, as in the specimen of FIG. 5(a), the PL intensity may be improved by increasing the thickness of the defect dispersion suppressing layer 23 to about 1.5 μm while the growth temperature is adjusted to about 970° C., so the growth temperature of the dispersion suppressing layer 23 is lower than that of the n-type semiconductor layer 25. Thus, the PL intensity can be optimized by controlling the growth pressure.

(Growth of Non-Polar Semiconductor Layer)

Figure 7:
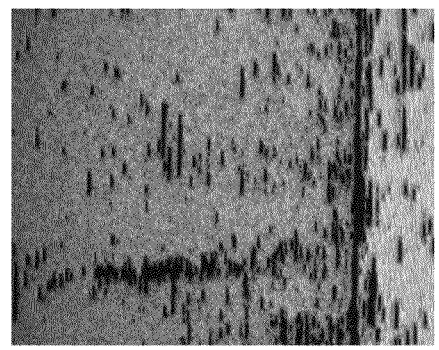
FIG. 7 is a microscope image showing a surface of a non-polar nitride semiconductor layer grown without a defect dispersion suppressing layer.

FIG. 7 is a microscope image showing a surface of a non-polar nitride semiconductor layer grown without a defect dispersion suppressing layer.

As described in FIG. 2, the specimen of FIG. 7 was prepared by directly growing an n-type contact layer 25 on a gallium nitride substrate 21 having an m(10-10) growth plane, followed by growing semiconductor layers including an active layer 27 and a p-type contact layer 29 thereon.

When the semiconductor layer 30 was grown without the defect dispersion suppressing layer 23, the semiconductor layer 30 had a rough surface, and that the defect region (shown as darker area) was dispersed over a wide area.

Figure 8:
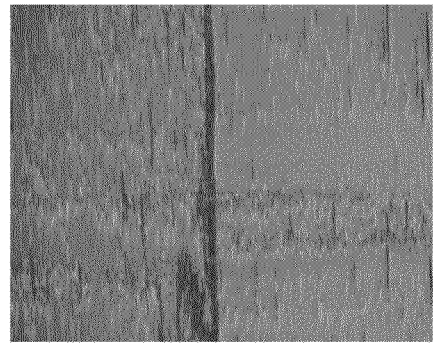
FIG. 8(a) and FIG. 8(b) are microscope images showing surfaces of non-polar nitride semiconductor layers on defect dispersion suppressing layers grown at a relatively high temperature under different growth pressures, respectively.
Figure 8:
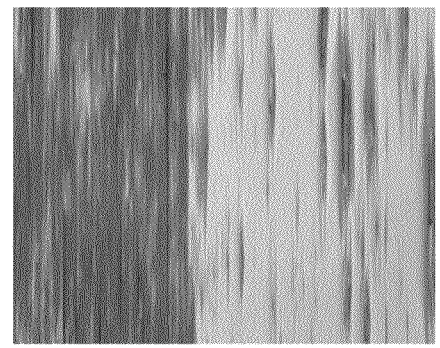

FIGS. 8(a) and 8(b) are microscope images showing surfaces of non-polar nitride semiconductor layers 30 on GaN defect dispersion suppressing layers 23 grown at a relatively high temperature (1030° C.) under different growth pressures (400 torr, 150 torr), respectively.

Specimens of FIGS. 8(a) and 8(b) were prepared by growing the defect dispersion suppressing layer 23 on a substrate 21 having a (10-10) growth plane, followed by growing the semiconductor layer 30 thereon in a similar manner as described with reference to FIG. 1(b). The specimen of FIG. 8(a) was prepared by growing the defect dispersion suppressing layer 23 at 1030° C. and about 400 torr and at a rate of about 2.5 μm/hr, followed by decreasing the temperature and growing the n-type semiconductor layer 25 at about 1000° C. and at a rate of about 3 μm/hr. The specimen of FIG. 8(b) was prepared in a similar manner as the specimen of FIG. 8(a), although there was a difference in that the specimen of FIG. 8(b) was grown at a pressure of 150 torr. The defect dispersion suppressing layer 23 was grown for about 50 minutes, and had a thickness of about 2.1 μm.

Referring to FIGS. 8(a) and 8(b), it can be confirmed that the surface quality of the semiconductor layer 30 was improved by interposing the defect dispersion suppressing layer 23 between the substrate 21 and the semiconductor layer 30. In particular, the surface quality can be relatively improved by lowering the growth pressure to 150 torr.

Figure 9:
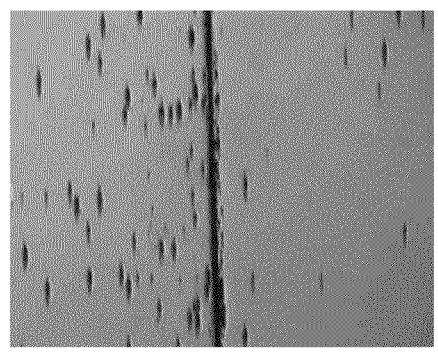
FIG. 9 is an microscope image showing a surface of a non-polar nitride semiconductor layer on a defect dispersion suppressing layer grown at a relatively low temperature.

FIG. 9 is a microscope image showing a surface of a non-polar nitride semiconductor layer 30 on a defect dispersion suppressing layer 23 grown at a relatively low temperature (960° C.).

In a specimen of FIG. 9, the defect dispersion suppressing layer 23 and the semiconductor layer 30 were grown under substantially the same conditions as in the specimen of FIG. 8(b), except that the defect dispersion suppressing layer 23 had a growth temperature of 960° C.

Referring to FIG. 9, the surface quality of the semiconductor layer 30 was improved by lowering the growth temperature of the defect dispersion suppressing layer 23 to 960° C.

From the experimental results, the defect region 30b may be suppressed from being dispersed by growing the defect dispersion suppressing layer 23 on the substrate 21 under different growth conditions from those of the n-type semiconductor layer 25.

Figure 10:
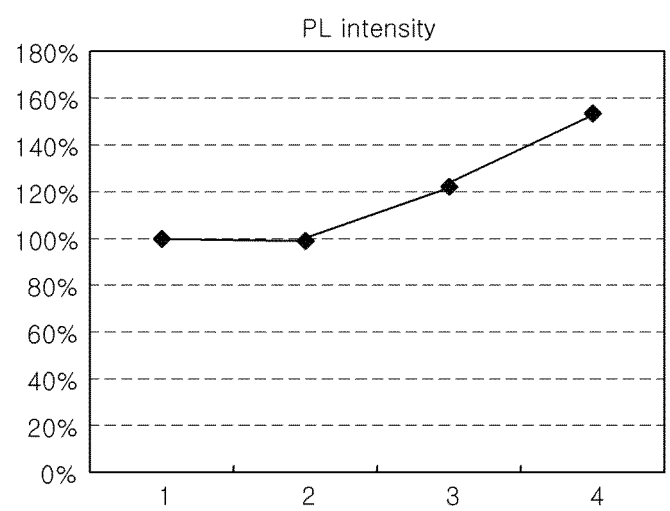
FIG. 10 is a graph depicting PL intensities of four specimens of FIG. 7, FIG. 8(a), FIG. 8(b), and FIG. 9, respectively.

FIG. 10 is a graph depicting PL intensities of four specimens of FIG. 7, FIG. 8(a), FIG. 8(b), and FIG. 9.

Referring to FIG. 10, the PL intensity was improved as the surface of the semiconductor layer 30 was improved (that is, formation of defect regions was reduced). In particular, the PL intensity can be increased by lowering the growth pressure of the defect dispersion suppressing layer 23 to 150 torr as in the specimen of FIG. 8(b). Further, the PL intensity can be further increased by lowering the growth temperature of the defect dispersion suppressing layer 23 to 960° C.

According to exemplary embodiments of the present invention, a nitride semiconductor layer having good crystal quality can be grown using the gallium nitride substrate described above as the growth substrate, and thus, a non-polar or semi-polar semiconductor device providing high productivity and yield can be fabricated. In particular, according to exemplary embodiments of the present invention, a defect region of the gallium nitride substrate may be prevented from spreading into the nitride semiconductor layer grown on the gallium nitride substrate.

Although the invention has been illustrated with reference to exemplary embodiments in conjunction with the drawings, it will be apparent to those skilled in the art that various modifications and changes can be made to the invention without departing from the spirit and scope of the invention. Further, it should be understood that some features of a certain exemplary embodiment may also be applied to other exemplary embodiments without departing from the spirit and scope of the invention. Therefore, it should be understood that the exemplary embodiments are provided by way of illustration only and are given to provide complete disclosure of the invention and to provide thorough understanding of the invention to those skilled in the art. Thus, it is intended that the present invention cover the modifications and variations provided they fall within the scope of the appended claims and their equivalents.

What is claimed is:

1. A nitride semiconductor device, comprising:
   a gallium nitride substrate comprising non-defect regions, a first defect region disposed between the non-defect regions, and a second defect region extending from the first defect region;
   a gallium nitride-based defect dispersion suppressing layer disposed on the gallium nitride substrate, and
   a gallium nitride semiconductor layer disposed on the defect dispersion suppressing layer,
   wherein a width of the second defect region on a surface of the gallium nitride semiconductor layer does not exceed two times a width of the first defect region, wherein the gallium nitride substrate comprises a semi-polar or non-polar substrate, and the non-defect regions comprise different off-angles with respect to a [0001] direction.

2. The nitride semiconductor device of claim 1, wherein the gallium nitride semiconductor layer comprises:
- an n-type contact layer disposed on the defect dispersion suppressing layer;
- a p-type contact layer disposed on the n-type contact layer; and
- an active layer disposed between the n-type and p-type contact layers.

3. The nitride semiconductor device of claim 2, wherein gallium nitride semiconductor layer further comprises a device separation region.

4. The nitride semiconductor device of claim 3, wherein the first defect region is disposed under the device separation region.

5. The nitride semiconductor device of claim 3, wherein the device separation region comprises a space formed in the gallium nitride semiconductor layer, and the first defect region is disposed entirely under the space.

6. The nitride semiconductor device of claim 1, wherein the defect dispersion suppressing layer is 1 μm to 2 μm thick.

\* \* \* \* \*